United States Patent
Kotake et al.

(10) Patent No.: US 9,012,842 B2
(45) Date of Patent: Apr. 21, 2015

(54) CHARGED PARTICLE BEAM DEVICE AND INCLINED OBSERVATION IMAGE DISPLAY METHOD

(71) Applicant: Hitachi High-Technologies Corporation, Minato-ku, Tokyo (JP)

(72) Inventors: Wataru Kotake, Tokyo (JP); Shigeru Kawamata, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/370,736

(22) PCT Filed: Dec. 20, 2012

(86) PCT No.: PCT/JP2012/083043
§ 371 (c)(1),
(2) Date: Jul. 3, 2014

(87) PCT Pub. No.: WO2013/103090
PCT Pub. Date: Jul. 11, 2013

(65) Prior Publication Data
US 2015/0001393 A1    Jan. 1, 2015

(30) Foreign Application Priority Data

Jan. 6, 2012 (JP) ................. 2012-001617

(51) Int. Cl.
*H01J 37/00* (2006.01)
*H01J 37/24* (2006.01)
*H01J 37/26* (2006.01)
*H01J 37/28* (2006.01)

(52) U.S. Cl.
CPC ............... *H01J 37/24* (2013.01); *H01J 37/261* (2013.01); *H01J 37/28* (2013.01)

(58) Field of Classification Search
CPC ..................... H01J 2237/2611; H01J 37/1478; H01J 37/28
USPC .................................. 250/306, 307, 310, 311
See application file for complete search history.

(56) References Cited

U.S. PATENT DOCUMENTS

| 2005/0285036 A1 | 12/2005 | Sato et al. |
| 2008/0179536 A1 | 7/2008 | Sato et al. |
| 2009/0322973 A1* | 12/2009 | Ito et al. ........................ 349/15 |

FOREIGN PATENT DOCUMENTS

| JP | 55-048610 Y2 | 11/1980 |
| JP | 02-033843 A | 2/1990 |

(Continued)

*Primary Examiner* — Michael Maskell
(74) *Attorney, Agent, or Firm* — Miles & Stockbridge P.C.

(57) ABSTRACT

A control device (50) for a charged particle beam device (100) tilts the irradiation axis of a primary electron beam (4) to the left, straight, or to the right via tilting coils (11, 12) each time the primary electron beam (4) scans the surface of a sample (15) over a single scanning line. When the irradiation axis is changed, the focal point of the primary electron beam (4) is adjusted by a focal point-adjusting coil (14) based on the tilt of the irradiation axis in order to take a left-tilted observation image, a non-tilted observation image or a right-tilted observation image of the surface of a sample (15) for each scanning line. The left-tilted observation images, non-tilted observation images and right-tilted observation images for the scanning lines obtained up to this point are simultaneously displayed on the same display device (31). In this way, focused non-tilted observation images and focused tilted observation images can be taken and displayed nearly simultaneously.

5 Claims, 8 Drawing Sheets

(56) References Cited

FOREIGN PATENT DOCUMENTS

| | | |
|---|---|---|
| JP | 2005-310602 A | 11/2005 |
| JP | 2006-012664 A | 1/2006 |
| JP | 2010-009907 A | 1/2010 |
| JP | 2011-040240 A | 2/2011 |
| JP | 2012-155911 A | 8/2012 |
| JP | 2013-232299 A | 11/2013 |

* cited by examiner

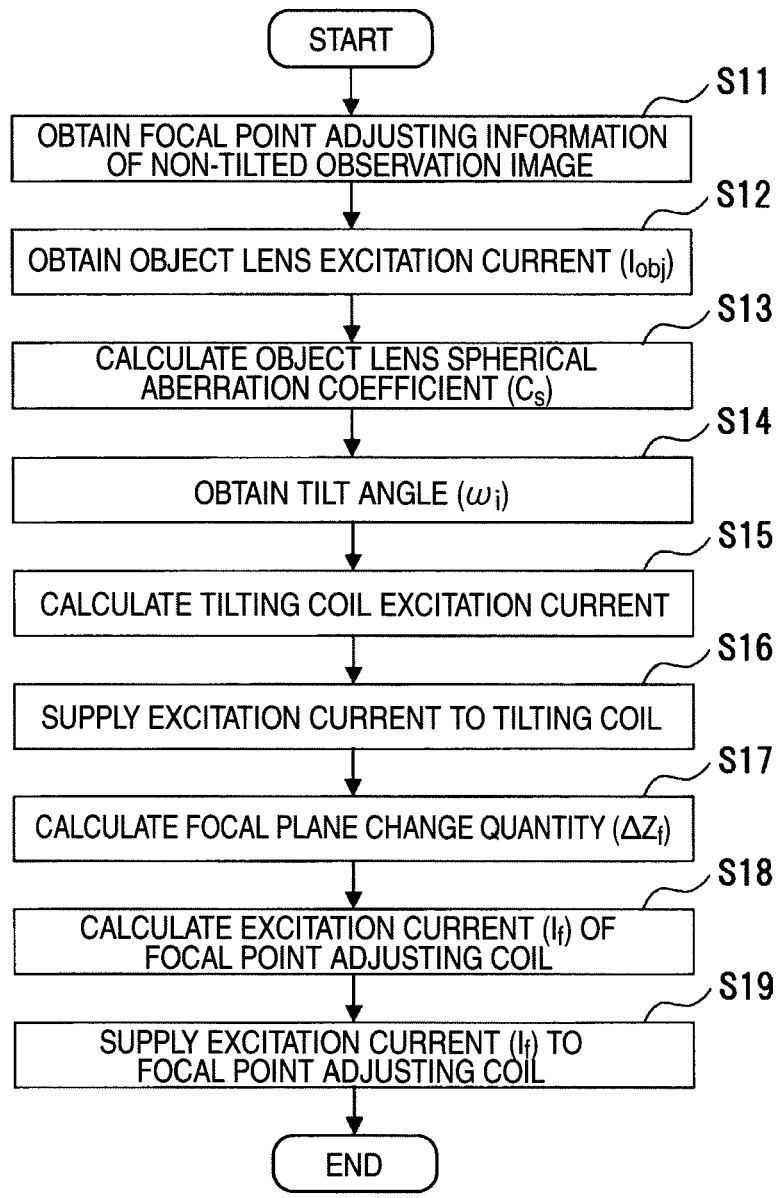

CHARGED PARTICLE BEAM DEVICE AND INCLINED OBSERVATION IMAGE DISPLAY METHOD

TECHNICAL FIELD

The present invention relates to a charged-particle beam device and a tilted observation image display method in which a tilted primary charged-particle beam is irradiated onto a sample to obtain and to display an tilted observation image.

BACKGROUND ART

Heretofore, in a charged-particle beam device represented by a scanning electron microscope, for example, by tilting the sample stage to the left and to the right to obtain a tilted image for the left eye and a tilted image for the right eye, to display a 3D (stereoscopic) observation image in the crossover method, the parallel method, or the anaglyph method using red-cyan glasses. Also, to obtain the left and right-tilted observation images as the source of the 3D observation image, in place of mechanical control to tilt the sample stage, there is conducted operation to tilt charged-particle beams irradiated on the sample by electromagnetic control.

For example, Patent literature 1 and 2 describe an operation to obtain observation images associated with different angles by tilting charged-particle beams. That is, charged-particle beams are controlled to irradiate on the outside of the axis of the objective lens and are tilted by use of the focusing action of the objective lens.

Further, Patent literature 3 and 4 disclose adjusting means to appropriately adjust the optical system when charged-particle beams are tilted. For example, Patent literature 3 describes an operation in which a non-tilted observation image (top-down image) is obtained and is formed into a template; thereafter, when obtaining a tilted observation image, pattern matching is conducted between the tilted observation image and the template, to thereby conduct image matching and astigmatism correction and the focus adjustment. Moreover, Patent literature 4 discloses a technique in which combinations of a plurality of lenses and the behavior of charged-particle beams when they are irradiated on the outside of the axis of the objective lens are analytically solved, and aberration taking place when charged-particle beams are tilted to irradiate on the sample is comprehensively cancelled by optical constituent components.

Further, Patent literature 5 discloses a technique in which the tilt of charged-particle beams is controlled for each line to obtain the left-tilted and right-tilted images at the same time and the obtained left and right-tilted images are displayed on a 3D display device, to thereby conduct 3D observation.

CITATION LIST

Patent Literature

Patent literature 1: JP-Y-55-048610
Patent literature 2: JP-A-02-033843
Patent literature 3: JP-A-2005-310602
Patent literature 4: JP-A-2006-012664
Patent literature 5: JP-A-2010-009907

SUMMARY OF INVENTION

Technical Problem

In the conventional scanning electron microscope or the like, one or two display areas of observation images are disposed in the display device in general. Hence, conventionally, when two display areas are present, each of the left-tilted and right-tilted observation images is displayed in the two display areas, or either one of the left-tilted and right-tilted observation images and a 3D observation image (for example, an anaglyph image) formed by processing the left-tilted or right-tilted observation image are displayed. Also, naturally, when one display area is present, only one selected from the left-tilted observation image, the right-tilted observation image, and the 3D observation image of the left-tilted or right-tilted observation image is displayed.

In this connection, in Patent literature 1 to 5, description has not been particularly given in detail of how to combine the left-tilted or right-tilted observation image with the 3D observation image of the left-tilted or right-tilted observation image. And, in the prior art, not limited to Patent literature 1 to 5, at least an operation in which the left-tilted or right-tilted observation image and a non-tilted observation image are simultaneously obtained and are simultaneously displayed is not conducted.

In general, it is easy that the non-tilted observation image is first obtained and is displayed, and then, the left-tilted or right-tilted observation image and the 3D observation image thereof are displayed. However, conventionally, when it is desired that a non-tilted observation image and a left-tilted or right-tilted observation image are simultaneously obtained and are simultaneously displayed, there arises a problem that due to difference in the focal position between both images, it is not possible to simultaneously obtain observation images in focus for both images. Incidentally, "simultaneously" described here means "simultaneously" in the sense of observing person; and for example, the difference in time of about one second is regarded as "simultaneously".

In consideration of these problems of the prior art, the present invention aims at providing a charged-particle beam device and a tilted observation image display method in which a non-tilted observation image in focus and a tilted observation image in focus can be almost simultaneously obtained and almost simultaneously displayed.

Solution to Problem

The charged particle-beam device according to the present invention comprises a charged-particle source; a plurality of electronic lenses to focus a primary charged-particle beam emitted from the charged-particle source; a charged-particle beam scanning control means to control deflection of the primary charged-particle beam in order that, when the focused primary charged-particle beam is irradiated onto a surface of a sample, an irradiation point thereof scans the surface of the sample two-dimensionally; an irradiation-axis tilting means to tilt an irradiation axis of the primary charged-particle beam when the primary charged-particle beam is irradiated onto the sample; a focal-position adjusting means to conduct an adjustment in order that a focal position when the irradiation axis of the primary charged-particle beam is tilted by the irradiation-axis tilting means becomes equal to a focal position when the irradiation-axis of the primary charged-particle beam is not tilted; a charged-particle detector to detect charged particles emitted from the sample when the primary charged-particle beam is irradiated onto the sample; and a control device to generate an observation image of the surface of the sample based on a signal detected by the charged-particle detector.

Further, it is characterized that the control device causes, via the irradiation-axis tilting means, the irradiation axis of the primary charged-particle beam to tilt left, not to tilt, or to tilt right each time the control device causes, via the charged-particle beam scanning control means, the primary charged-particle beam to scan the surface of the sample for one scanning line; and when the irradiation axis is changed, the control device adjusts, via the focal-position adjusting means, the focal position of the primary charged-particle beam according to a tilted state of the irradiation axis, to obtain a left-tilted observation image, a non-tilted observation image, or a right-tilted observation image of the surface of the sample for the one scanning line, and simultaneously displays the left-tilted observation image, the non-tilted observation image, and the right-tilted observation image with respect to scanning lines obtained up to this time, on one and the same display device.

According to the present invention, each time the primary charged-particle beam scans one scanning line, the observation image of one scanning line of the left-tilted image, the non-tilted image, or the right-tilted image is alternately obtained and is displayed. Hence, the difference in the display time between the left-tilted image, the non-tilted image, and the right-tilted image is the scanning time of one scanning line, so that for at least the user, the left-tilted image, the non-tilted image, and the right-tilted image are almost simultaneously obtained and are almost simultaneously displayed.

Further, adjustment of the focal position between the tilted observation images and the non-tilted observation image is almost simultaneously carried out by use of focal position adjusting means (focal point adjusting coil). Hence, each of the observation image of one scanning line of the left-tilted image, the non-tilted image, or the right-tilted image can be an observation image in focus.

Advantageous Effects of Invention

According to the present invention, there are provided a charged-particle beam device and a tilted observation image display method in which a non-tilted observation image in focus and a tilted observation image in focus can be almost simultaneously obtained and they look as if displayed almost simultaneously.

BRIEF DESCRIPTION OF DRAWINGS

FIG. 5A is a diagram illustrating an example of scanning lines when the primary electron beam scans the surface of a sample.

FIG. 5B is a diagram illustrating an example of a tilting coil control signal and a scanning coil control signal in each observation mode.

FIG. 8 is a flowchart showing an example of a processing flow of main processing to be executed by a control device when adjusting is conducted in steps S01 to S03 of the observation image adjusting flow represented in FIG. 6.

DESCRIPTION OF EMBODIMENTS

Next, description will be given in detail of an embodiment of the present invention by referring to the accompanying drawings.

Figure 1:
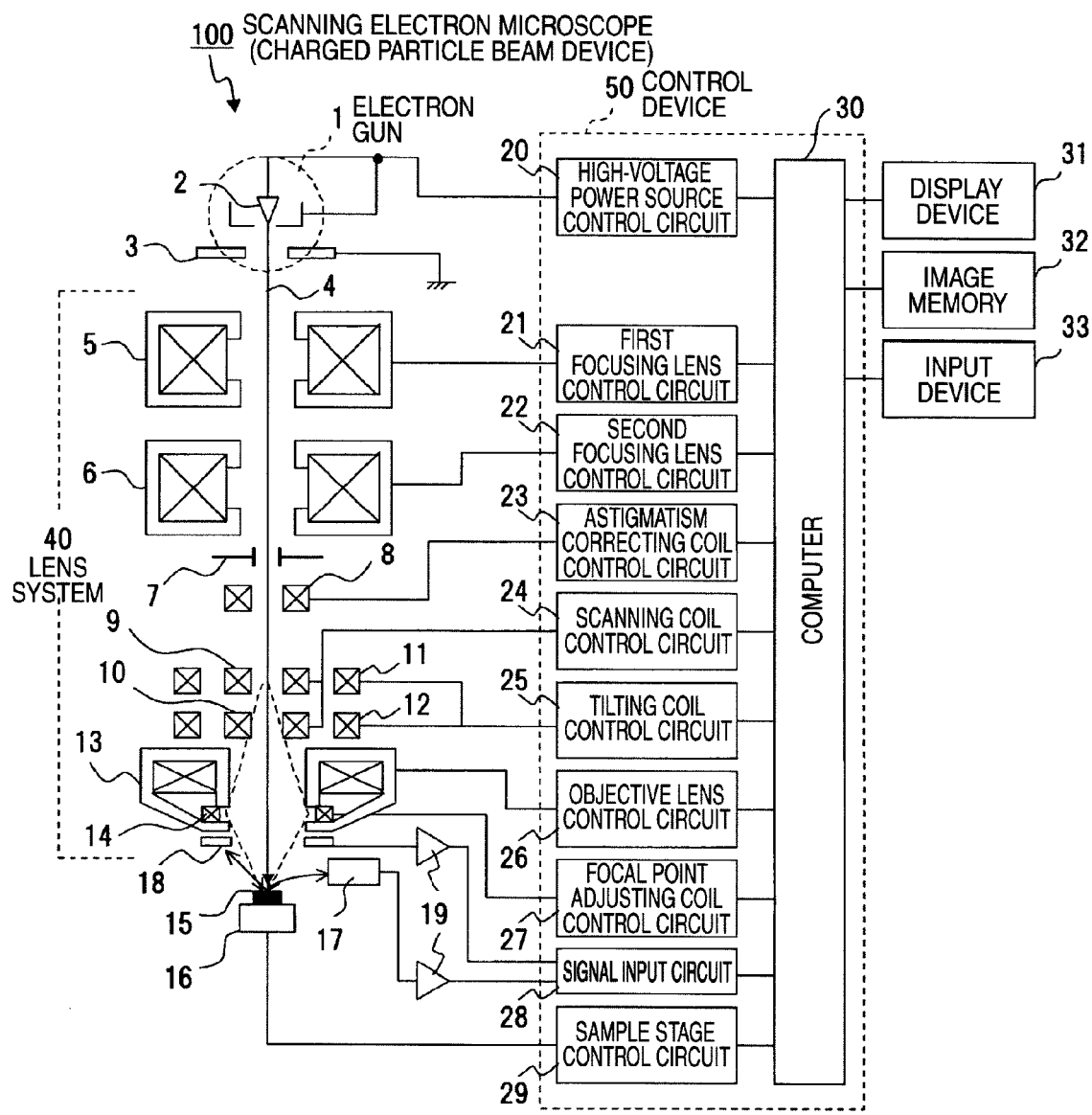
FIG. 1 is a diagram illustrating an example of a general configuration of a scanning electron microscope (charged-particle beam device) according to an embodiment of the present invention.

FIG. 1 is a diagram illustrating an example of a general configuration of a scanning electron microscope (charged-particle beam device) according to an embodiment of the present invention. The scanning electron microscope 100 is a representative example of the charged-particle beam device; in the present description, the charged-particle beam device is assumed as the scanning electron microscope 100 in the explanation below.

In the scanning electron microscope 100, a cathode 2 and an anode 3 configure an electron gun 1 as a charged-particle source (electron source). Between the cathode 2 and the anode 3, when a high voltage controlled by a high-voltage power source control circuit 20 is applied, a primary electron beam 4 as a primary charged-particle beam is emitted from the cathode 2. The primary electron beam 4 emitted from the cathode 2 is accelerated by an accelerating anode (not shown) and is fed to a lens system 40 including a first focusing lens 5, a second focusing lens 6, and an objective lens 13.

The primary electron beam 4 fed to the lens system 40 is first focused while passing through the first focusing lens 5 and the second focusing lens controlled by a first focusing lens control circuit 21 and a second focusing lens control circuit 22, and then unnecessary part of the primary electron beam 4 is removed by an aperture plate 7, and the beam 4 is fed to an astigmatism correcting coil 8 controlled by an astigmatism correcting coil control circuit 23.

The primary electron beam 4 having passed through the astigmatism correcting coil control circuit 23 further passes through upper-stage and lower-stage scanning coils 9 and 10 controlled by a scanning coil control circuit 24 and through upper-stage and lower-stage tilting coils 11 and 12 controlled by a tilting coil control circuit 25 and is fed to the objective lens 13 controlled by an objective lens control circuit 26.

The primary electron beam 4 having passed through the objective lens 13 is again focused by the objective lens 13 and is irradiated onto the surface of a sample 15 mounted on a sample stage 16. Incidentally, the sample stage 16 is controlled by a sample stage control circuit 29 and is capable of conducting not only movement in x, y, and z directions, but also rotation and tilt of a sample mount surface. In this connection, the x-y plane is ordinarily a horizontal plane and the z direction is a direction perpendicular to the horizontal plane.

The primary electron beam 4 receives, when passing through the scanning coils 9 and 10, electromagnetic force generated according to scanning coil control signals (a horizontal deflection signal, a vertical deflection signal, and the like) supplied to the scanning coils 9 and 10, and is deflected in the x and y directions according to necessity; as a result, the irradiation point of the primary electron beam 4 on the surface of the sample 15 two-dimensionally scans the surface of the sample 15. Also, the primary electron beam 4 receives, when passing through the tilting coils 11 and 12, electromagnetic force generated according to tilting coil control signals supplied to the tilting coils 11 and 12, and is deflected.

Moreover, a focal point adjusting coil 14 which is controlled by a focal-point adjusting-coil control circuit 27 and which is ordinarily employed for automatic focal point adjustment is disposed together with the objective lens 13. Incidentally, in the embodiment of the present invention, the focal point adjusting coil 14 serves a function to match the focal position when the primary electron beam 4 is tilted with the focal position when the primary electron beam 4 is not tilted; the function will be described in detail later.

When the primary electron beam 4 is irradiated onto the surface of the sample 15, secondary electrons and reflection electrons are emitted from the irradiated place. The emitted secondary electrons and reflection electrons are detected by a secondary electron detector 17 and a reflection electron detector 18, and detection signals thereof are amplified by a signal amplifier 19 and are then received via a signal input circuit 28 by a computer 30.

The detection signals of secondary electrons and reflection electrons received by the computer 30 are processed for images according to necessity and are stored in an image memory 32 as an observation image of the surface of the sample 15 and are displayed on a display device 31.

Here, the computer 30 is the center of a control device 50 and is connected to the high-voltage power-source control circuit 20, the first focusing-lens control circuit 21, the second focusing-lens control circuit 22, the astigmatism-correcting coil control circuit 23, the scanning-coil control circuit 24, the tilting-coil control circuit 25, the objective-lens control circuit 26, the focal-point-adjusting coil control circuit 27, the signal input circuit 28, and the sample-stage control circuit 29 which are other constituent components of the control device 50, and comprehensively controls these control circuits.

Further, to the computer 30, an input device 33 such as a keyboard, a mouse, or a trackball is connected, so that the user can set via the input device 33 the observation image acquiring condition (for example, the acceleration voltage, the scanning speed, and the tilt angle at tilted observation image acquisition of the primary electron beam 4).

Moreover, although details will be described later, in the present embodiment, the left-tilted or right-tilted observation image of the surface of the sample 15 is obtained not by tilting the sample stage 16 on which the sample is mounted mechanically to the left or the right, but the left-tilted or right-tilted observation image of the surface of the sample 15 is obtained by controlling the excitation currents of the tilting coils 11 and 12 to thereby tilt the primary electron beam 4 irradiated on the surface of the sample 15 to the left or to the right.

Figure 2:
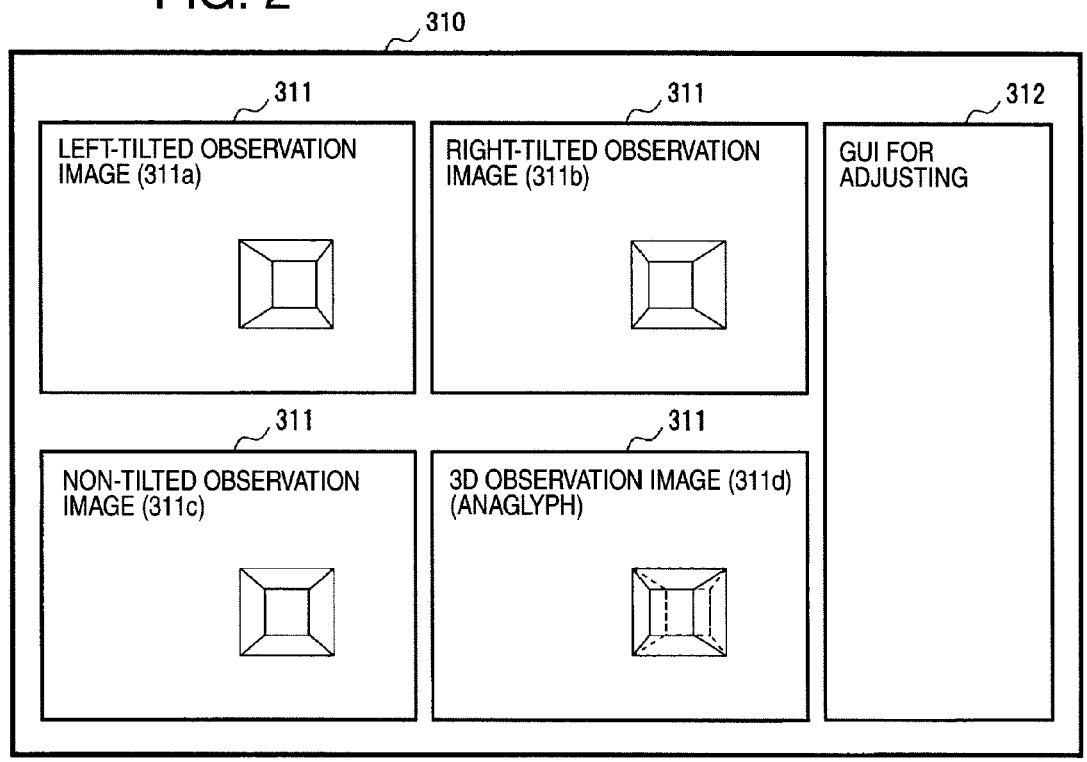
FIG. 2 is a diagram illustrating a configuration example of an observation image display screen displayed on a display device in the scanning electron microscope according to the embodiment of the present invention.

FIG. 2 is a diagram illustrating a configuration example of an observation image display screen displayed on the display device 31 in the scanning electron microscope 100 according to the embodiment of the present invention. As illustrated in FIG. 2, the observation image display screen 310 displayed on the display device 31 is configured by including four observation image display areas 311 and one adjusting Graphical User Interface (GUI) area 312.

In each of these four observation image display areas 311, a left-tilted observation image 311a, a right-tilted observation image 311b, a non-tilted observation image 311c, and 3D observation image 311d are displayed. Also, in the adjusting GUI area 312, when various adjustments such as focusing are conducted at acquisition of these display images, information and buttons which help the user for operation are shown.

Further, although details will be described later, in the present embodiment, for each scanning line, while one-line observation image data of the left-tilted observation image 311a, the right-tilted observation image 311b, or the non-tilted observation image 311c are being obtained, they are displayed. Consequently, each of the left-tilted observation image 311a, the right-tilted observation image 311b, and the non-tilted observation image 311c are almost simultaneously obtained and are almost simultaneously displayed only with time difference of one-line scanning time therebetween. However, the 3D observation image 311d such as an anaglyph is displayed with a delay of its creation time; however, the creation time is one second or less; hence, it can be considered that also the 3D observation image 311d is almost simultaneously displayed.

Figure 3:
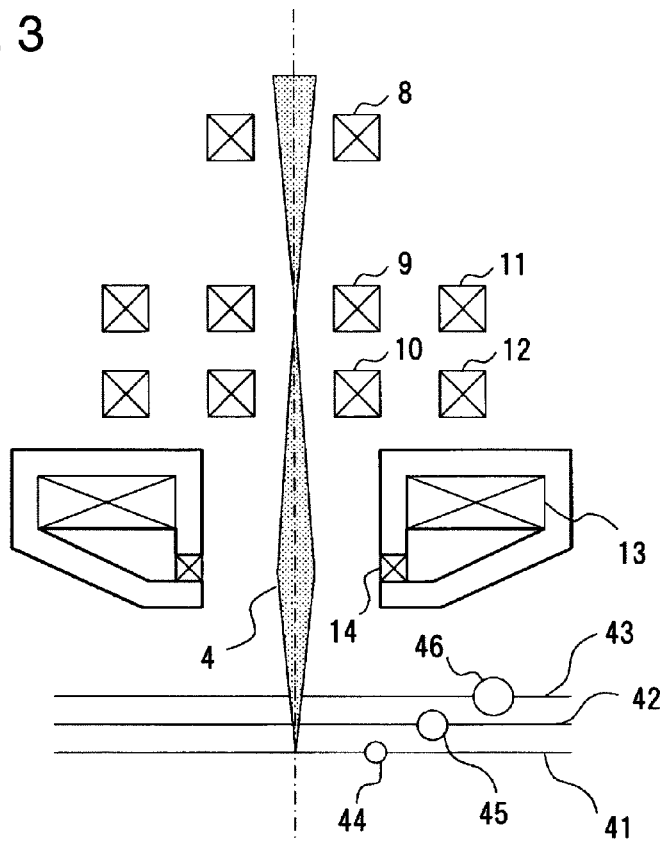
FIG. 3 is a diagram schematically illustrating a relationship between a plurality of focal planes and beam diameters on the respective focal planes for the primary electron beam at non-tilted observation.

FIG. 3 is a diagram schematically illustrating a relationship between a plurality of focal planes and beam diameters on the respective focal planes for the primary electron beam 4 at non-tilted observation. As illustrated in FIG. 3, in the case of the non-tilted observation, after the scanning and deflection control is conducted for the primary electron beam 4 by the scanning coils 9 and 10, the primary electron beam 4 passes through almost the center of the objective lens 13 and is irradiated substantially perpendicularly onto the surface of the sample 15.

Here, in a situation wherein astigmatism has been adjusted, a beam shape 44 is formed on the focal plane 41, and the highest resolution results.

On the other hand, the beam diameter of the beam shape 45 on the focal plane 42 nearer to the objective lens 13 than the focal plane 41 is larger than the beam diameter of the beam shape 44. Also, the beam diameter of the beam shape 46 on the focal plane 43 much nearer to the objective lens 13 than the focal plane 42 is still larger than the beam diameter of the beam shape 45. In this fashion, when the beam diameter becomes larger, resolution of the obtained observation image is lowered according to the beam diameter.

Figure 4:
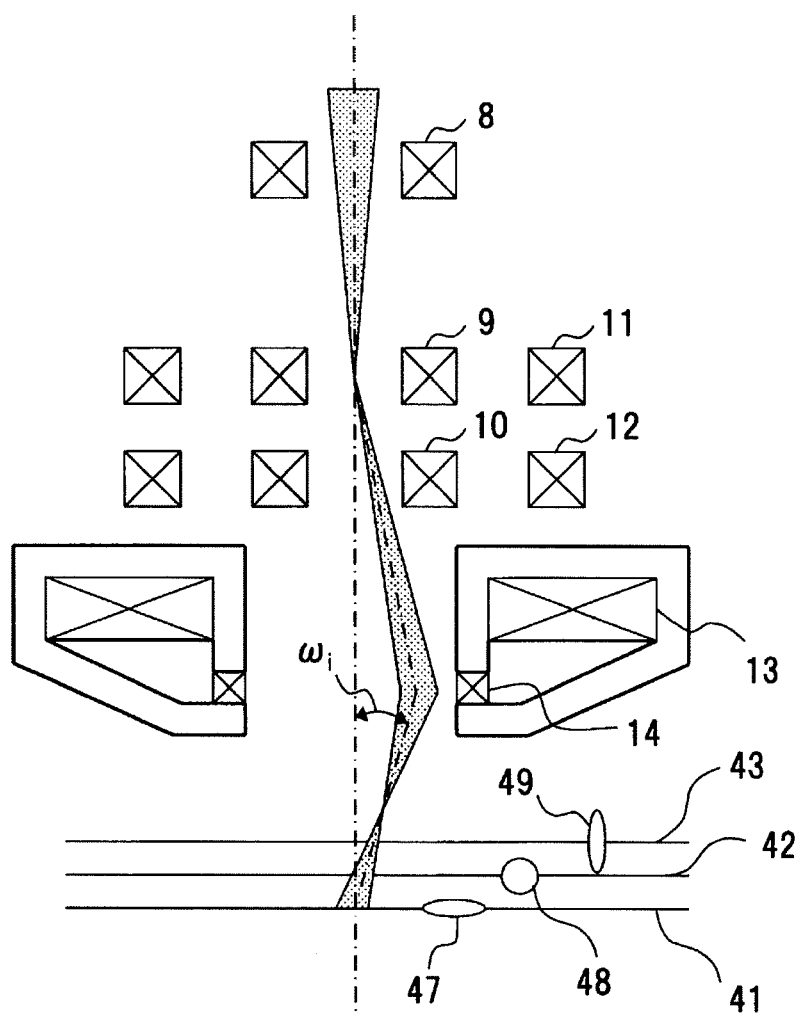
FIG. 4 is a diagram schematically illustrating a relationship between a plurality of focal planes and beam contours on the respective focal planes for the primary electron beam at tilted observation.

FIG. 4 is a diagram schematically illustrating a relationship between a plurality of focal planes and beam contours on the respective focal planes for the primary electron beam 4 at tilted observation. At tilted observation, as illustrated in FIG.

4, the scanning and deflection control is conducted for the primary electron beam 4 by the scanning coils 9 and 10, and in addition, the tilt control is conducted for it by the tilting coils 11 and 12. As a result, the primary electron beam 4 passes the outside of the center axis of the objective lens 13 and is irradiated on the surface (for example, the focal planes 41, 42, 43) of the sample 15 from above obliquely on the left side or the right side.

In general, in a situation wherein after the focal point adjustment is conducted at non-tilted observation, the left-tilted or right-tilted observation is carried out without changing the operational condition (such as the excitation current) for the objective lens 13 and the focal-point-adjusting coil 14, the focal position of the primary electron beam 4 focused by the objective lens 13 is moved to the objective lens 13 side relative to the focal plane 41 at non-tilted observation (refer to FIG. 3).

This is because for example at tilted observation, if the beam shape 48 is formed on the focal plane 42, the beam shapes 47 and 49 are formed on the focal plane 41 and 43 (refer to FIG. 3). Hence, resolution of the obtained observation image is high for the beam shape 48 and is low for the beam shapes 47 and 49.

As described above, what is to be considered based on the results of the description of FIGS. 3 and 5 is that when the tilted observation is conducted after the non-tilted observation is conducted or when the non-tilted observation is conducted after the tilted observation is conducted, if it is desired to obtain an observation image with possibly high resolution, it is required, in the observation mode changeover between the non-tilted observation and the tilted observation, to conduct adjustment of control parameters for the lens system 40 such as the focal point adjustment.

Figure 5A:
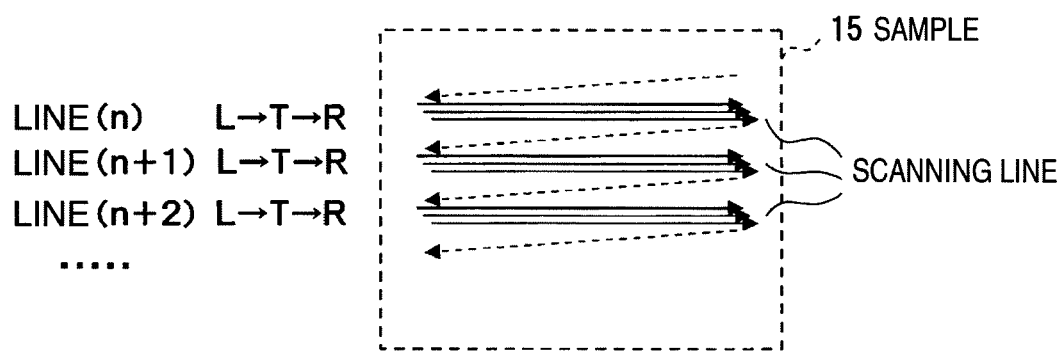
FIG. 5A is a diagram schematically illustrating an example of deflection and scanning control of the primary electron beam when a non-tilted observation image and a tilted observation image are simultaneously obtained in the embodiment of the present invention.
Figure 5B:
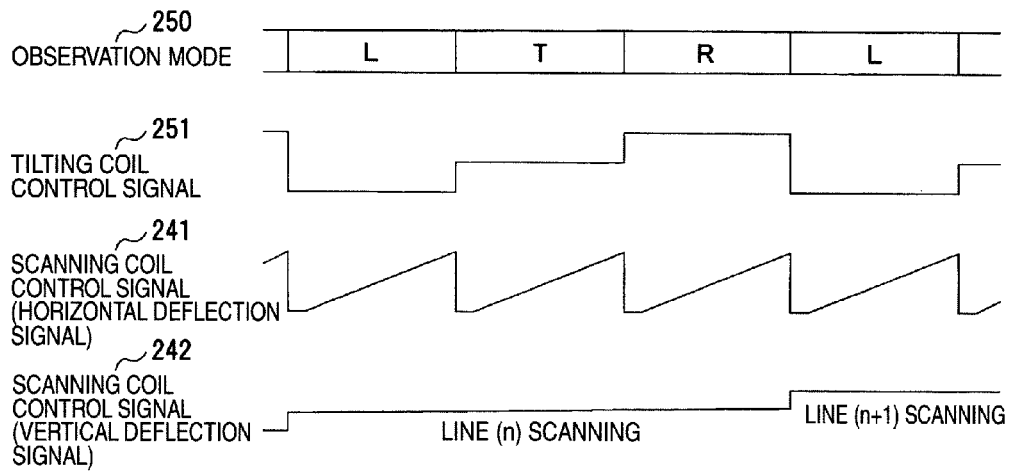
FIG. 5B is a diagram schematically illustrating an example of deflection and scanning control of the primary electron beam when a non-tilted observation image and a tilted observation image are simultaneously obtained in the embodiment of the present invention.

FIGS. 5A and 5B are diagrams schematically illustrating an example of deflection and scanning control of the primary electron beam 4 when a non-tilted observation image and a tilted observation image are simultaneously obtained in an embodiment of the present invention, and FIG. 5A is a diagram illustrating an example of scanning lines when the primary electron beam 4 scans the surface of a sample 15 and FIG. 5B is a diagram illustrating an example of an tilting coil control signal and a scanning coil control signal in each observation mode. Incidentally, in the description of FIGS. 5A and 5B and subsequent description, symbol L indicates a left-tilted observation mode to obtain a left-tilted observation image, symbol T indicates a non-tilted observation mode to obtain a non-tilted observation image, and symbol R indicates a right-tilted observation mode to obtain a right-tilted observation image.

In the present embodiment, the control device 50 (refer to FIG. 1) obtains the left-tilted observation image, the non-tilted observation image, or the right-tilted observation image, while changing the observation mode each time it causes the primary electron beam 4 to conduct scanning of one scanning line. That is, as illustrated in FIG. 5A, while the observation mode is changed as L→T→R, one scanning line is scanned once in each observation mode and three times in total. And the scanning of this kind is repeatedly carried out, by advancing to the subsequent scanning line in the line-by-line manner, for all scanning lines of one frame. Incidentally, in FIG. 5A, the three scanning operations of one scanning line are indicated by three horizontal-directional arrow lines slightly apart from each other.

As described above, to conduct the scanning of the primary electron beam 4 described in conjunction with FIG. 5A, the control device 50 supplies an tilting coil control signal 251 (refer to FIG. 5B) which is changed in synchronism with the change of the observation mode 250 (L, T, R) via the tilting coil control circuit 25 to the tilting coils 11 and 12. Also, the control device 50 supplies a scanning coil control signal 241 for the horizontal deflection control in synchronism with the change of the observation mode 250 (L, T, R) via the scanning coil control circuit 24 to the scanning coils 9 and 10; and further supplies a scanning coil control signal 242 (refer to FIG. 5B) for the vertical deflection control in synchronism with the change of the observation mode 250 from R to L (that is, completion of three scanning operations).

The control device 50 is required, in order to simultaneously obtain the non-tilted observation image and the tilted observation image, to further conduct control to change the focal position, in addition to the control of the tilting coils 11 and 12 and the scanning coils 9 and 10 described above. That is, as described by referring to FIGS. 3 and 4, in the non-tilted observation mode and the tilted observation mode, the focal position differs, when the control parameters (excitation currents) for the objective lens 13 and the focal point adjusting coil 14 are equal. Hence, to obtain the observation images with better resolution in both modes, the focal positions are required to be equal to each other in both modes.

In the present embodiment, when a non-tilted observation image is obtained (referred to as a non-tilted observation mode hereinafter), the focusing is conducted by use of the objective lens 13; when a tilted observation image is obtained (referred to as a tilted observation mode hereinafter), the excitation current of the focal point adjusting coil 14 is adjusted with the position of the sample 15 and the excitation current of the objective lens 13 kept unchanged, to thereby make the focal position in the tilted observation mode equal to that in the non-tilted observation mode.

As a result, when the observation mode 250 changes from the tilted observation mode to the non-tilted observation mode or from the non-tilted observation mode to the tilted observation mode, the control device 50 can make the focal position in the non-tilted observation mode equal to that in the tilted observation mode only by conducting control to change, via the focal point adjusting coil control circuit 27, the excitation current to be supplied to the focal point adjusting coil 14.

Incidentally, the focal position and the excitation current of the objective lens 13 in the non-tilted observation mode and the excitation current of the focal point adjusting coil 14 in the tilted observation mode are beforehand adjusted to be obtained. The adjusting procedure will be next described in detail.

Moreover, as described above, in the present description, the control by the control device 50 is based on the control parameters (the excitation currents) of the objective lens 13 and the focal point adjusting coil 14 in the non-tilted observation mode, and the control parameter of the focal point adjusting coil 14 in the tilted observation mode is changed (this also applies to the description below). However, without being restricted by the explanation, the control by the control device 50 may be based on the control parameters of the objective lens 13 and the focal point adjusting coil 14 in the left-tilted (or right-tilted) observation mode, and the control parameters of the focal point adjusting coil 14 in the non-tilted observation mode and the left-tilted (or right-tilted) observation mode are changed.

Figure 6:
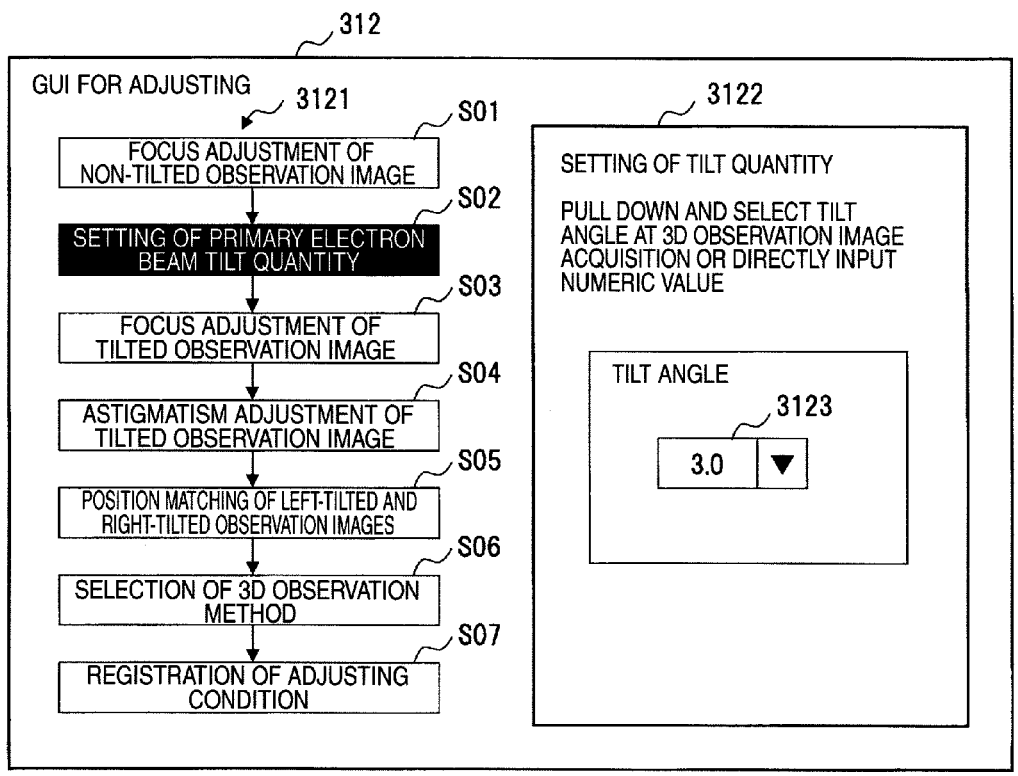
FIG. 6 is a diagram representing an example in which an observation image adjusting flow to be conducted by a user is displayed in an adjusting GUI area of the observation image display screen.
Figure 7A:
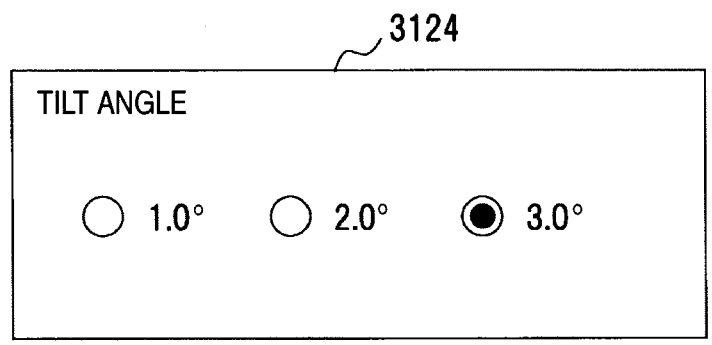
FIG. 7A is a diagram illustrating another example of a control parameter setting GUI displayed in the adjusting GUI area.
Figure 7B:
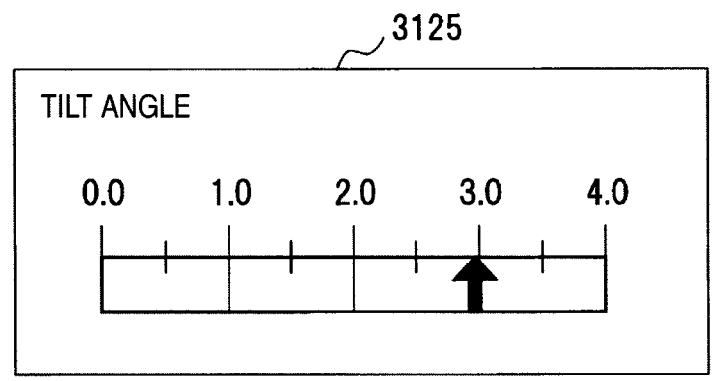
FIG. 7B is a diagram illustrating another example of a control parameter setting GUI displayed in the adjusting GUI area.

FIG. 6 is a diagram illustrating an example in which an observation image adjusting flow to be conducted by the user is displayed in the adjusting GUI area 312 of the observation image display screen 310. Also, FIGS. 7A and 7B are diagrams illustrating other examples of a control parameter setting GUI displayed in the adjusting GUI area 312.

The observation image adjusting flow 3121 shown in FIG. 6 represents a procedure of adjusting operations to be beforehand conducted by the user to make it possible to simultaneously obtain a non-tilted observation image and a tilted observation image, and is provided for convenience of user's adjusting operations.

For example, in the observation image adjusting flow 3121, a step in which the user is currently conducting an adjustment is displayed in a white-black reverse mode. Also, in the adjusting GUI area 312, a user assist area 3122 is displayed in the proximity of the area in which the observation image adjusting flow 3121 is displayed. And, in the user assist area 312, there are displayed explanation items of adjustment contents regarding the step (displayed in the white-black reverse mode) in which the adjustment is being currently conducted, an input box 3123, and a radio button 3124 and a slider bar 3125 illustrated in FIGS. 7A and 7B, for the user to input data.

Next, description will be given of the contents of the observation image adjusting flow 3121. The user first conducts focal point adjustment for the non-tilted observation image (step S01). The operation contents are the same as for the focal point adjustment of an observation image to be conducted by a general scanning electronic microscope; the control device 50 acquires various control parameters (for example, an acceleration voltage and an excitation current of the objective lens 13) for the electronic gun 1 and the lens system 40, the parameters being determined as the final results of the focal point adjusting operation conducted by the user.

Next, the user sets the tilt quantity of the primary electron beam 4 (step S02). Here, the control device 50 displays, in the user assist area 3122, the input box 3123 or the like for the user to input a tilt angle. Then, when the user directly inputs a tilt angle in the input box 3123 or the user selects a value from pull-down displayed values and inputs the value therein, the control device 50 acquires the numeric value inputted to the input box 3123 as the tilt angle of the primary electron beam 4.

Incidentally, the tilt angle described here is an angle ($\omega_i$: refer to FIG. 4) between the primary electron beam 4 irradiated on the surface of the sample 15 and the center axis of the objective lens at tilted observation, and corresponds to an angle of incidence when the primary electron beam 4 is irradiated on the surface of the sample 15. However, the angle of incidence when it is irradiated on the surface of the sample 15 at non-tilted observation is 0° (that is, the primary electron beam 4 is irradiated vertically on the surface of the sample 15 horizontally held on the sample stage 16). And, between the non-tilted observation and the tilted observation, the position and the tilt of the sample 15 are not changed.

Incidentally, in FIG. 6, the tilt angle is inputted via the input box 3123 to the control device 50; however, it may be inputted via the radio button 3124 and the slider bar 3125 illustrated in FIGS. 7A and 7B to the control device 50. Here, in the display of the radio button 3124 and the like, the unit of the tilt angle is not limited to 1.0°, but may be a small angle such as 0.1° or 0.5°; further, may be a large angle such as 2°.

Subsequently, the control device 50 calculates, based on the obtained tilt angle, the excitation currents of the tilt coils 11 and 12 and supplies the calculated excitation currents to the tilt coils 11 and 12. As a result, the primary electron beam 4 is tilted and the tilted observation mode is implemented.

Thereafter, the user conducts the focal point adjustment for the tilted observation image (step S03). In this situation, the operation contents to be conducted by the user are basically the same as for the focal point adjustment of the non-tilted observation image in step S01; however, in the focal point adjustment in this step, the position and the tilt of the sample 15 are not changed. Hence, the focal point adjustment in step S03 is an adjustment using the focal point adjusting coil 14, and the control device 50 obtains the excitation current or the like of the focal point adjusting coil 14 determined by the focal point adjustment.

Incidentally, in steps S01 to S03, the contents of main processing to be executed by the control device 50, that is, the computer 30 will be separately described in detail by referring to FIG. 8.

Next, the user conducts the astigmatism adjustment of the tilted observation image (step S04). Since astigmatism takes place in the tilted observation mode, the user corrects and adjusts the astigmatism. Further, the user conducts the position matching for the left-tilted and right-tilted observation images (step S05); when a plurality of methods are prepared for the 3D observation such as anaglyph, the user selects the 3D observation method (step S06).

Incidentally, in the observation image adjusting flow of FIG. 6 to be conducted by the user, the adjustments in steps S03 to S05 are not necessarily carried out in this sequence, but the user may arbitrarily change the sequence of these adjustments.

Finally, the user registers the adjusting conditions adjusted in the operation up to step S06 (step S07). Specifically, the user causes the adjusting conditions adjusted up to this point (various control parameters (various control voltages and currents) outputted from the control device 50 to the electron gun 1 and the lens system 40) to be stored in a storage device of the computer 30.

FIG. 8 is a flowchart representing an example of a processing flow of main processing to be executed by the control device 50 when adjusting is conducted in steps S01 to S03 of the observation image adjusting flow 3121 shown in FIG. 6, and is a processing flow up to acquisition of the initial observation image of the tilted observation image required for the user to start the focal point adjustment of the tilted observation image in step S03.

First, the user conducts the focal point adjustment of the non-tilted observation image; the control device 50 displays various adjusting GUI to assist the focal point adjustment and obtains focal point adjusting information (for example, various control parameters such as the acceleration voltage ($V_1$)) when the optimal focal point is obtained for the non-tilted observation image (step S11), and then, as the most important control parameter as the focal point adjusting information, obtains the excitation current ($I_{obj}$) of the objective lens 13 (step S12).

Next, the control device 50 calculates the objective lens spherical aberration coefficient ($C_s$) by using the obtained excitation current ($I_{obj}$) of the objective lens 13 and Expression (1) shown below (step S13). Here, description of details about the functional expression $F_1(I_{obj})$ included in expression (1) will be avoided.

[Math. 1]

$$C_S = F_1(I_{obj}) \qquad (1)$$

In this connection, the objective lens spherical aberration coefficient ($C_s$) may be obtained, without using expression (1), by referring to a control table beforehand set for respective acceleration voltages ($V_1$) and excitation currents ($I_{obj}$).

Next, the user sets the tilt angle via the input box 3123 (FIG. 6: refer to the user assist area 3122), and the control device 50 obtains the inputted tilt angle ($\omega_i$; step S14).

Next, the control device 50 calculates the excitation currents of the tilting coils 11 and 12 corresponding to the obtained tilt angle ($\omega_i$; step S14), and at tilted observation, it supplies the calculated excitation currents of the tilting coils 11 and 12 (step S16). As a result, at tilted observation, the irradiation center axis of the primary electron beam 4 is tilted with respect to the center axis of the objective lens 13.

Next, the control device 50 calculates the focal plane change quantity ($\Delta Z_f$; step S17). The focal plane change quantity ($\Delta Z_f$) is, as described by use of FIGS. 3 and 4, a movement quantity when the optimal focal plane moves between the non-tilted observation and the tilted observation; and is, in general, given by Expression (2) using the spherical aberration coefficient ($C_s$) of the objective lens 13 and the angle between the primary electron beam 4 and the center axis of the objective lens 13, namely, the on-sample tilt angle ($\omega_i$).

[Math. 2]

$$\Delta Z_f = C_s \times \omega_i^2 \quad (2)$$

Next, the control device 50 calculates the excitation current ($I_f$) of the focal point adjusting coil 14 by using Expression (5), which will be described later (step S18).

Here, the excitation adjusting quantity ($\Delta E_{xf}$) of the focal point adjusting coil 14 is given by Expression (3) using the focal plane change quantity ($\Delta Z_f$). Incidentally, description of the functional expression $G(\Delta Z_f)$ included in Expression (3) will be avoided.

[Math. 3]

$$\Delta E_{xf} = G(\Delta Z_f) \quad (3)$$

Also, the excitation adjusting quantity ($\Delta E_{xf}$) of the focal point adjusting coil 14 is given by Expression (4) below by using the excitation adjusting quantity ($\Delta E_{xf}$), the number of turns ($N_f$), and the acceleration voltage ($V_1$) of the focal point adjusting coil 14.

[Math. 4]

$$\Delta E_{xf} = \frac{N_f \cdot I_f}{\sqrt{V_1}} \quad (4)$$

Hence, the excitation current ($I_f$) of the focal point adjusting coil 14 is represented by Expression (5) below, based on Expressions (3) and (4).

[Math. 5]

$$I_f = \frac{\Delta E_{xf} \cdot \sqrt{V_1}}{N_f} = \frac{G(\Delta Z_f) \cdot \sqrt{V_1}}{N_f} \quad (5)$$

Incidentally, here, the focal point adjusting coil excitation current ($I_f$) is calculated based on Expression (5); however, the focal point adjusting coil excitation current ($I_f$) may be obtained by referring to the control table beforehand set for the acceleration voltage ($V_1$) and the focal plane change quantity ($\Delta Z_f$).

Next, the control device 50 supplies the focal point adjusting coil 14 with the excitation current ($I_f$) of the focal point adjusting coil 14 calculated by using Expression (5) at tilted observation (step S19).

Through the operation above, the focal point adjustment at tilted observation has been automatically conducted by the computer 30. However, since the focal point adjustment has been automatically conducted, it does not necessarily satisfy the user; hence, the tilted observation image obtained under this condition is used as an initial observation image for the focal point adjustment of the tilted observation image, which will be conducted thereafter by the user.

Figure 9:
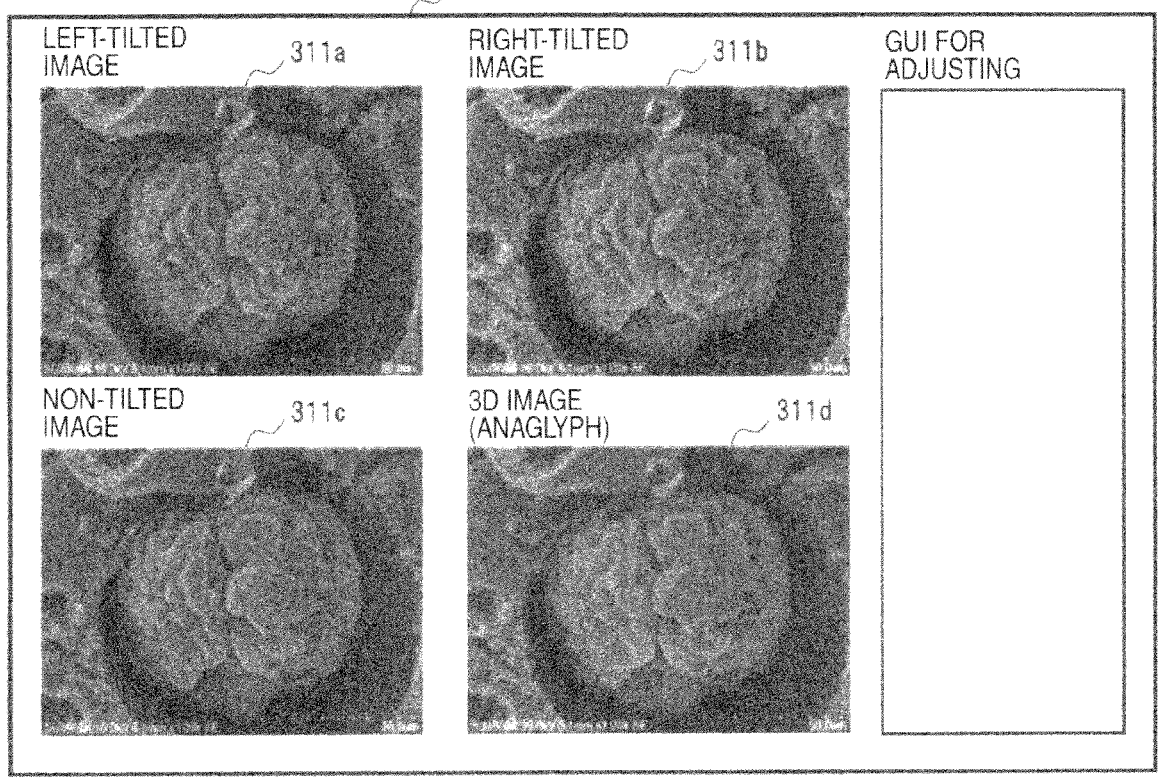
FIG. 9 is a diagram representing an example of a left-tilted observation image, a right-tilted observation image, a non-tilted observation image, and a 3D observation image actually obtained by use of a scanning electron microscope according to the embodiment of the present invention.

FIG. 9 is a diagram representing an example of the left-tilted observation image 311*a*, the right-tilted observation image 311*b*, the non-tilted observation image 311*c*, and the 3D observation image 311*d* actually obtained by using the scanning electron microscope 100 according to the embodiment of the present invention.

As described above, according to the present embodiment, when the user or the control device 50 executes the focal point adjusting flows of the non-tilted observation image and the tilted observation image represented in FIGS. 6 and 8, it is possible that the left-tilted observation image 311*a*, the right-tilted observation image 311*b*, the non-tilted observation image 311*c*, and the 3D observation image 311*d* shown in FIG. 9 are almost simultaneously obtained and are almost simultaneously displayed in a state in which all images are in focus.

Incidentally, this is possible because when the control device 50 conducts a changeover between the non-tilted observation mode and the tilted observation mode, the focal point adjustment is immediately conducted therebetween only by changing the excitation current of the focal point adjusting coil 14, without changing the excitation current of the objective lens 13. That is, since the objective lens 13 includes an iron core, the response time of the focal point adjustment is long due to its hysteresis phenomenon, while, since the focal point adjusting coil 14 includes no iron core, the response time of the focal point adjustment is short. Consequently, in the present embodiment, the focal distance can be almost instantaneously changed between the non-tilted observation mode and the tilted observation mode, so that it becomes possible to conduct the changeover between the non-tilted observation mode and the tilted observation mode for each scanning line.

(First Variation Example Of Embodiment)

In the embodiment of the present invention, as illustrated in FIGS. 5A and 5B, the observation mode change of L→T→R is conducted for each scanning of one scanning line; however, it is also possible that without conducting the change for each scanning of one scanning line, the observation mode change of L→T→R is conducted each time the observation image of one frame (for example, 512 scanning lines of one screen) is obtained. In this case, it is not required to scan one scanning line three times.

(Second Variation Example Of Embodiment)

Figure 10:
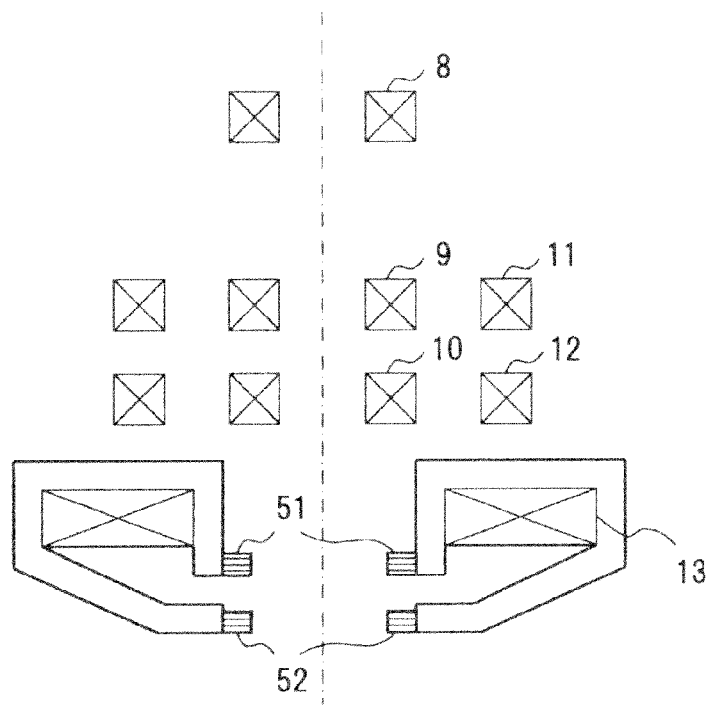
FIG. 10 is a diagram illustrating an example of the principal part configuration of focal point adjusting means at tilted observation in a second variation of the embodiment of the present invention.

FIG. 10 is a diagram illustrating an example of the principal configuration of focal point adjusting means at tilted observation in a second variation of the embodiment of the present invention. In the embodiment of the present invention and the first variation example thereof, the focal point adjusting coil 14 is employed as focal point adjusting means at tilted observation; however, in this second variation example, in place of the focal point adjusting coil 14, electrostatic lenses 51 and 52 disposed in the proximity of the objective lens 13 are employed as focal point adjusting means as illustrated in FIG. 10.

Incidentally, also in this situation, the observation mode change of L→T→R may be conducted each time one scanning line is scanned or for each frame.

(Third Variation Example Of Embodiment)

Figure 11:
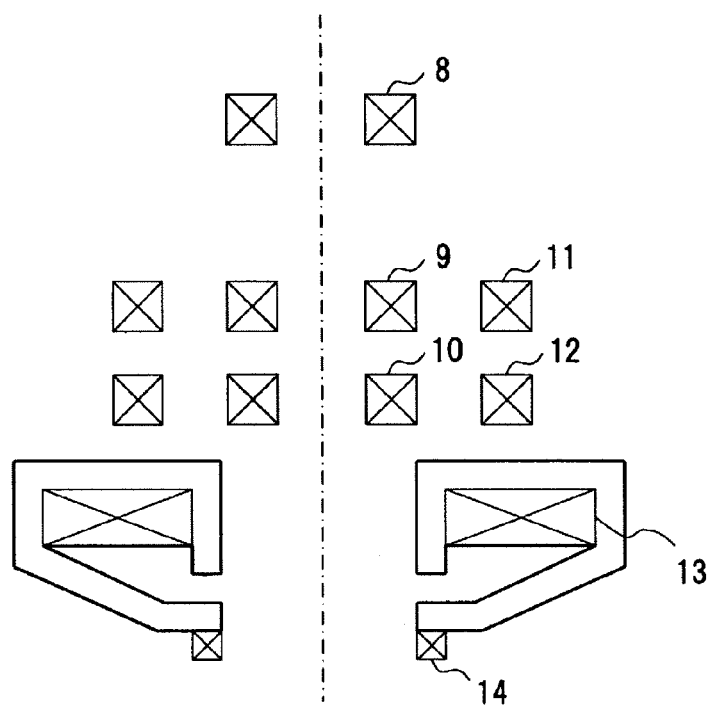
FIG. 11 is a diagram illustrating an example of the principal part configuration of focal point adjusting means at tilted observation in the third variation of the embodiment of the present invention.

FIG. 11 is a diagram illustrating an example of the principal configuration of focal point adjusting means at tilted observation in a third variation example of the embodiment of the present invention. In the embodiment of the present invention and the first variation thereof, the focal point adjusting coil 14 employed as focal point adjusting means at tilted observation is disposed in the proximity of a magnetic pole of the objective lens 13; however, the position is not limited to the proximity of a magnetic pole, but the focal point adjusting coil 14 may be disposed, as illustrated in FIG. 11, in the proximity of the lower surface of the objective lens 13. Also, in consideration of the second variation example, in place of the focal point adjusting coil 14, the electrostatic lenses (51, 52) may be disposed in the proximity of the lower surface of the objective lens 13.

(Fourth Variation Example Of Embodiment)

Figure 12:
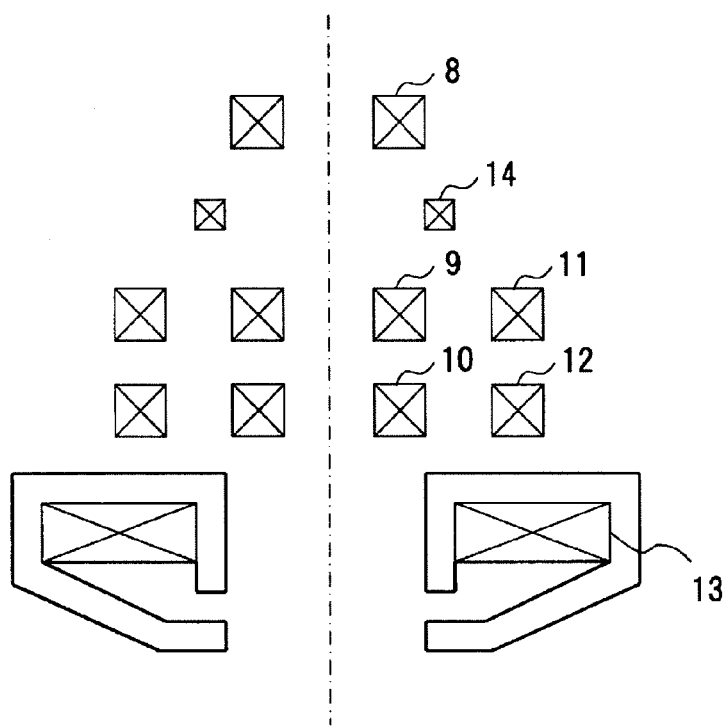
FIG. 12 is a diagram illustrating an example of the principal part configuration of focal point adjusting means at tilted observation in a fourth variation of the embodiment of the present invention.

FIG. 12 is a diagram illustrating an example of the principal configuration of focal point adjusting means at tilted observation in a fourth variation of the embodiment of the present invention. In the embodiment of the present invention and the first variation thereof, the focal point adjusting coil 14 employed as focal point adjusting means at tilted observation is disposed in the proximity of a magnetic pole of the objective lens 13; however, the position is not limited to the proximity of a magnetic pole, but the focal point adjusting coil 14 may be disposed, as illustrated in FIG. 12, at a position on the electron gun 1 side relative to the objective lens 13. Also, in consideration of the second variation, in place of the focal point adjusting coil 14, the electrostatic lenses (51, 52) may be disposed at a position on the electron gun 1 side relative to the objective lens 13.

While the present invention has been described with reference to the embodiment, it is not to be restricted by the embodiment; it is to be appreciated that those skilled in the art can change or modify the embodiment within the spirit and the appended claims of the present invention.

REFERENCE SIGNS LIST

1 Electronic gun (Charged-particle source)
2 Cathode
3 Anode
4 Primary electron beam (Charged-particle beam)
5 First focusing lens
6 Second focusing lens
7 Aperture plate
8 Astigmatism correcting coil
9, 10 Scanning coil (Charged-particle beam scanning control means)
11, 12 Tilting coil (Irradiation axis tilting means)
13 Objective lens
14 Focal point adjusting coil (Focal position adjusting means)
15 Sample
16 Sample stage
17 Secondary electron detector (Charged-particle detector)
18 Reflection electron detector (Charged-particle detector)
19 Signal amplifier
20 High-voltage power source control circuit
21 First focusing lens control circuit
22 Second focusing lens control circuit
23 Astigmatism correcting coil control circuit
24 Scanning coil control circuit
25 Tilting coil control circuit
26 Objective lens control circuit
27 Focal point adjusting coil control circuit
28 Signal input circuit
29 Sample stage control circuit
30 Computer
31 Display device
32 Image memory
33 Input device
40 Lens system
50 Control device
51 Electrostatic lens
100 Scanning electron microscope (Charged-particle beam device)
241 Scanning coil control signal (Horizontal deflection signal)
242 Scanning coil control signal (Vertical deflection signal)
250 Observation mode
251 Tilting coil control signal
310 Observation image display screen
311 Observation image display area
311a Left-tilted observation image
311b Right-tilted observation image
311c Non-tilted observation image
311d 3D observation image
312 Adjusting GUI area
3121 Observation image adjusting flow
3122 User assist area
3123 Input box
3124 Radio button
3125 Slider bar

The invention claimed is:

1. A charged-particle beam device, comprising a charged-particle source; a plurality of electronic lenses to focus a primary charged-particle beam emitted from the charged-particle source; a charged-particle beam scanning control means to control deflection of the primary charged-particle beam in order that, when the focused primary charged-particle beam is irradiated onto a surface of a sample, an irradiation point thereof scans the surface of the sample two-dimensionally; an irradiation-axis tilting means to tilt an irradiation axis of the primary charged-particle beam when the primary charged-particle beam is irradiated onto the sample; a focal-position adjusting means to conduct an adjustment in order that a focal position when the irradiation axis of the primary charged-particle beam is tilted by the irradiation-axis tilting means becomes equal to a focal position when the irradiation-axis of the primary charged-particle beam is not tilted; a charged-particle detector to detect charged particles emitted from the sample when the primary charged-particle beam is irradiated onto the sample; and a control device to generate an observation image of the surface of the sample based on a signal detected by the charged-particle detector, characterized in that the control device causes to control the primary charged-particle beam to scan a same scanning line as one scanning line on the surface of the sample for three times via the irradiation-axis tilting means, the irradiation axis of the primary charged-particle beam to tilt left, not to tilt, or to tilt right in sequence in each of the three scans via the charged-particle beam scanning control means; and when the irradiation axis is changed, the control device adjusts, via the focal-position adjusting means, the focal position of the primary charged-particle beam according to a left-tilted state, a non-tilted state, or right-tilted state of the irradiation axis, to obtain a left-tilted observation image, a non-tilted observation image, or a right-tilted observation image focused on the surface of the sample for the one scanning line, and simultaneously displays the focused left-tilted observation image, the focused non-tilted observation image, and the focused right-tilted observation image with respect to scanning lines obtained up to this time, on one and the same display device.

2. A charged-particle beam device in accordance with claim 1, characterized in that the control device further creates a focused 3D observation image using the focused left-tilted observation image and the focused right-tilted observation image and simultaneously displays the focused created 3D observation image, the focused left-tilted observation image, the focused right-tilted observation image, and the focused non-tilted observation image, on one and same display device.

3. A charged-particle beam device in accordance with claim 1, characterized in that the focal-position adjusting means includes a coil not including a metallic core of magnetic material.

4. An tilted observation-image display method in a charged-particle beam device comprising a charged-particle source; a plurality of electronic lenses to focus a primary charged-particle beam emitted from the charged-particle source; a charged-particle beam scanning control means to control deflection of the primary charged-particle beam in order that, when the focused primary charged-particle beam is irradiated onto a surface of a sample, an irradiation point thereof scans the surface of the sample two-dimensionally; an irradiation-axis tilting means to tilt an irradiation axis of the primary charged-particle beam when the primary charged-particle beam is irradiated onto the sample; a focal-position adjusting means to conduct an adjustment in order that a focal position when the irradiation axis of the primary charged-particle beam is tilted by the irradiation-axis tilting means becomes equal to a focal position when the irradiation-axis of the primary charged-particle beam is not tilted; a charged-particle detector to detect charged particles emitted from the sample when the primary charged-particle beam is irradiated onto the sample; and a control device to generate an observation image of the surface of the sample based on a signal detected by the charged-particle detector, characterized in that the control device causes to control the primary charged-particle beam to scan a same scanning line as one scanning line on the surface of the sample for three times via the irradiation-axis tilting means, the irradiation axis of the primary charged-particle beam to tilt left, not to tilt, or to tilt right in sequence in each of the three scans via the charged-particle beam scanning control means; and when the irradiation axis is changed, the control device adjusts, via the focal-position adjusting means, the focal position of the primary charged-particle beam according to a left-tilted state, a non-tilted state, or right-tilted state of the irradiation axis, to obtain a left-tilted observation image, a non-tilted observation image, or a right-tilted observation image focused on the surface of the sample for the one scanning line, and simultaneously displays the focused left-tilted observation image, the focused non-tilted observation image, and the focused right-tilted observation image with respect to scanning lines obtained up to this time, on one and the same display device.

5. A tilted observation-image display method in accordance with claim 4, characterized in that the control device further creates a focused 3D observation image using the focused left-tilted observation image and the focused right-tilted observation image and simultaneously displays the created focused 3D observation image on one and same display device together with the focused left-tilted observation image, the focused right-tilted observation image, and the focused non-tilted observation image.

* * * * *